(12) United States Patent
Kashihara et al.

(10) Patent No.: US 11,996,504 B2
(45) Date of Patent: May 28, 2024

(54) LIGHT-EMITTING DEVICE AND METHOD OF MANUFACTURING THE SAME

(71) Applicant: NICHIA CORPORATION, Anan (JP)

(72) Inventors: Shoichi Kashihara, Tokushima (JP); Masanobu Sato, Tokushima (JP); Toshimasa Amiya, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/112,916

(22) Filed: Feb. 22, 2023

(65) Prior Publication Data

US 2023/0207752 A1     Jun. 29, 2023

Related U.S. Application Data

(60) Continuation of application No. 17/181,780, filed on Feb. 22, 2021, now Pat. No. 11,621,379, which is a (Continued)

(30) Foreign Application Priority Data

Jan. 31, 2018  (JP) ................................ 2018-014328

(51) Int. Cl.
*H01L 33/00* (2010.01)
*H01L 25/075* (2006.01)
(Continued)

(52) U.S. Cl.
CPC .......... *H01L 33/54* (2013.01); *H01L 25/0753* (2013.01); *H01L 33/486* (2013.01);
(Continued)

(58) Field of Classification Search
CPC ..... H01L 33/505; H01L 33/508; H01L 33/54; H01L 33/56; H01L 2933/005; H01L 2933/0091

See application file for complete search history.

(56) References Cited

U.S. PATENT DOCUMENTS

| 9,391,249 B2 | 7/2016 | Hong et al. |
| 2009/0146171 A1 | 6/2009 | Okubo |

(Continued)

FOREIGN PATENT DOCUMENTS

| JP | 2000-269555 A | 9/2000 |
| JP | 2001-77433 A | 3/2001 |

(Continued)

OTHER PUBLICATIONS

Advisory Action issued in U.S. Appl. No. 16/262,284, dated Nov. 27, 2020.

(Continued)

*Primary Examiner* — Reema Patel
(74) *Attorney, Agent, or Firm* — Birch, Stewart, Kolasch & Birch, LLP

(57) ABSTRACT

A light-emitting device 100 includes: a light-emitting element; a light-transmissive member covering the light-emitting element; and a light-diffusing agent contained in the light-transmissive member and comprising hollow particles. The light-transmissive member has a first surface having irregularities according to the light-diffusing agent. The first surface of the light-transmissive member has a convex shape with a height gradually increased from a peripheral portion of the first surface toward a central portion of the first surface.

9 Claims, 9 Drawing Sheets

Related U.S. Application Data division of application No. 16/262,284, filed on Jan. 30, 2019, now Pat. No. 10,964,859.

(51) Int. Cl.
  *H01L 33/48* (2010.01)
  *H01L 33/50* (2010.01)
  *H01L 33/54* (2010.01)
  *H01L 33/56* (2010.01)
  *H01L 33/30* (2010.01)
  *H01L 33/62* (2010.01)
  *H01L 33/64* (2010.01)

(52) U.S. Cl.
  CPC .......... *H01L 33/505* (2013.01); *H01L 33/508* (2013.01); *H01L 33/56* (2013.01); *H01L 33/30* (2013.01); *H01L 33/62* (2013.01); *H01L 33/647* (2013.01); *H01L 2933/0041* (2013.01); *H01L 2933/005* (2013.01); *H01L 2933/0091* (2013.01)

(56) References Cited

U.S. PATENT DOCUMENTS

| | | |
|---|---|---|
| 2010/0289048 A1 | 11/2010 | Kumura |
| 2011/0006668 A1 | 1/2011 | Hussell et al. |
| 2011/0248287 A1 | 10/2011 | Yuan et al. |
| 2012/0161621 A1 | 6/2012 | Sato |
| 2016/0104827 A1 | 4/2016 | Hong et al. |
| 2017/0054110 A1 | 2/2017 | Racz et al. |
| 2017/0288104 A1 | 10/2017 | Ukawa et al. |
| 2017/0345982 A1 | 11/2017 | Abe et al. |
| 2019/0348584 A1 | 11/2019 | Abe et al. |

FOREIGN PATENT DOCUMENTS

| | | |
|---|---|---|
| JP | 2002-141557 A | 5/2002 |
| JP | 4167717 B1 | 10/2008 |
| JP | 2009-141051 A | 6/2009 |
| JP | 2012-151466 A | 8/2012 |
| JP | 2014-138081 A | 7/2014 |
| JP | 2015-84384 A | 4/2015 |
| JP | 2015-225994 A | 12/2015 |
| JP | 2016-72379 A | 5/2016 |
| JP | 2016-72382 A | 5/2016 |
| JP | 2016-178344 A | 10/2016 |
| JP | 2017-515310 A | 6/2017 |
| JP | 2017-126045 A | 7/2017 |
| JP | 2017-135427 A | 8/2017 |
| JP | 2017-183578 A | 10/2017 |
| JP | 2017-216369 A | 12/2017 |
| WO | WO 2009/066398 A1 | 5/2009 |
| WO | WO 2015/093379 A1 | 6/2015 |

OTHER PUBLICATIONS

Corrected Notice of Allowance issued in U.S. Appl. No. 17/181,780, dated Jan. 12, 2023.
Exparte Quayle Action issued in U.S. Appl. No. 17/181,780, dated Sep. 15, 2022.
Final Office Action issued in U.S. Appl. No. 16/262,284, dated Sep. 9, 2020.
Non-Final Office Action issued in U.S. Appl. No. 16/262,284, dated Mar. 13, 2020.
Non-Final Office Action issued in U.S. Appl. No. 17/181,780, dated May 10, 2022.
Notice of Allowance issued in U.S. Appl. No. 16/262,284, dated Dec. 23, 2020.
Notice of Allowance issued in U.S. Appl. No. 17/181,780, dated Dec. 5, 2022.
Restriction/Election issued in U.S. Appl. No. 16/262,284, dated Dec. 16, 2019.
Restriction/Election issued in U.S. Appl. No. 17/181,780, dated Apr. 4, 2022.

LIGHT-EMITTING DEVICE AND METHOD OF MANUFACTURING THE SAME

CROSS-REFERENCE TO RELATED APPLICATION

This application is a Continuation of co-pending U.S. application Ser. No. 17/181,780, filed on Feb. 22, 2021, which is a Divisional of U.S. application Ser. No. 16/262,284, filed on Jan. 30, 2019 (now U.S. Pat. No. 10,964,859, issued on Mar. 30, 2021), which is based upon and claims the benefit of priority from Japanese Patent Application No. 2018-014328, filed on Jan. 31, 2018, the contents of which are hereby incorporated by reference in their entirety.

BACKGROUND OF THE INVENTION

1. Field of the Invention

The present disclosure relates to a light-emitting device and a method of manufacturing the same.

2. Description of Related Art

White light-emitting devices employing phosphors such as yellow phosphors and red phosphors are widely used in recent years, and various studies on improvement in the light extraction efficiency, reduction of unevenness in emission color, and the like have been conducted.

In Japanese Patent No. 4167717, which describes one example of such light emitting devices, a surface of a sealing resin has projecting portions to improve light extraction efficiency and luminance.

SUMMARY OF THE INVENTION

However, the color of the phosphor is visible through the light-emitting surface of the light-emitting device in Japanese Patent No. 4167717, and thus an emission color of the light emitting device is different from an object color of the light-emitting surface.

In the case in which the light-emitting device mounted in a lighting fixture, when the light-emitting surface is turned off, the object color of the phosphor is conspicuous, which may impair the design aesthetics.

In view of this, one object of the present disclosure is to uniform the object color of the light-emitting surface.

A light-emitting device according to one embodiment of the present disclosure includes: a light-emitting element; a light-transmissive member covering the light-emitting element; and a light-diffusing agent contained in the light-transmissive member and comprising hollow particles. The light-transmissive member has a first surface having irregularities according to the light-diffusing agent. The first surface of the light-transmissive member has a convex shape with a height gradually increased from a peripheral portion of the first surface toward a central portion of the first surface.

A method of manufacturing a light-emitting device according to another embodiment of the present disclosure includes providing a first in-process product including a base member having a recess, and a light-emitting element placed on or above an inner bottom surface of the base member; injecting a light-transmissive member comprising a light-diffusing agent comprising hollow particles into the recess; allowing the hollow particles to float up to a first surface of the injected light-transmissive member to form the light-transmissive member into a convex shape; and hardening the light-transmissive member.

Another method of manufacturing a light-emitting device according to even another embodiment of the present disclosure includes providing a second in-process product including a plate-like base member, a light-emitting element placed on or above the base member, and an annular protruding part surrounding the light-emitting element; injecting a light-transmissive member comprising a light-diffusing agent comprising hollow particles into inward of the protruding part to form the light-transmissive member into a convex shape with a thickness gradually increased from a peripheral portion of the light-transmissive member toward a central portion of the light-transmissive member; allowing the hollow particles to float up to a first surface of the light-transmissive member; and hardening the light-transmissive member Certain embodiments of the present disclosure allows the object color of the light-emitting surface to be uniform.

DETAILED DESCRIPTION OF EMBODIMENTS

Figure 1A:
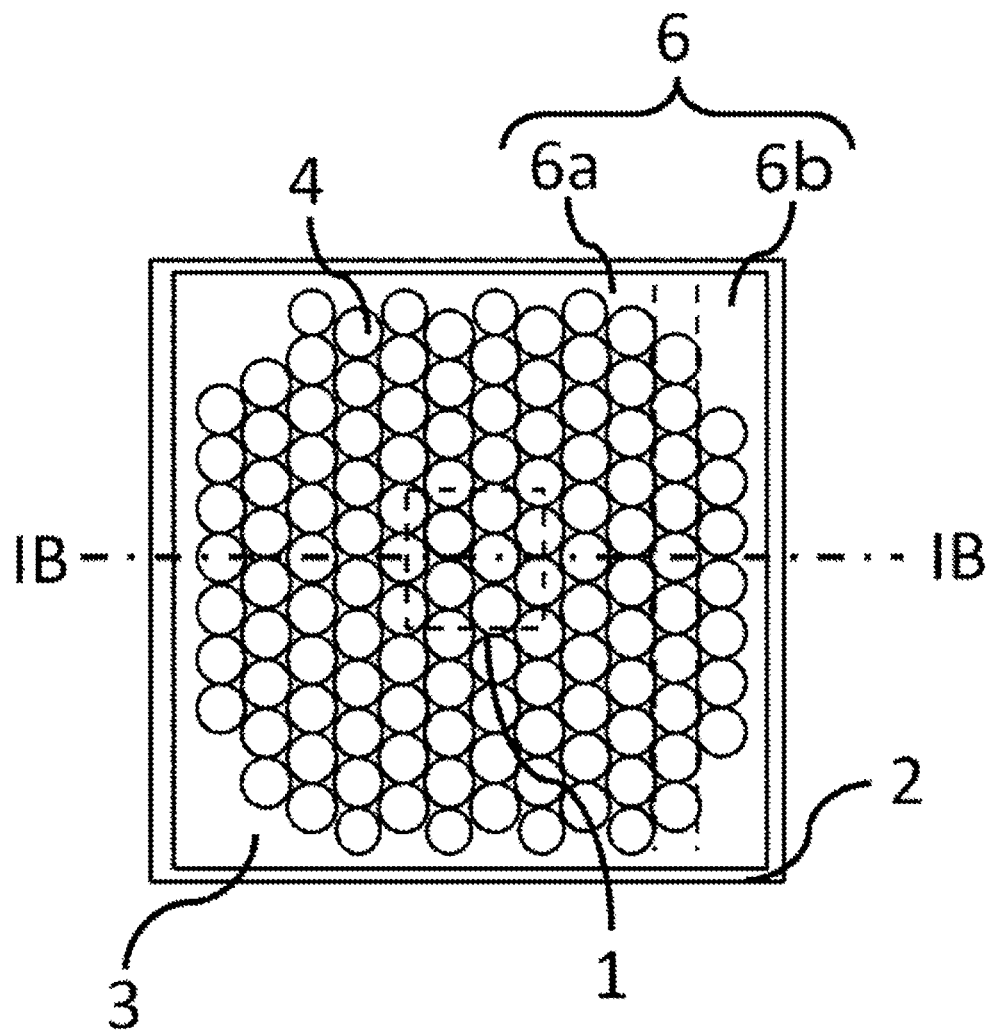
FIG. 1A is a schematic plan view of a light-emitting device according to a first embodiment.

The following describes embodiments of the invention referring to the accompanying drawings as appropriate. A light-emitting devices to be described below is intended to give a concrete form to the technical idea of the present invention, and does not limit the present invention to the description below. In particular, unless specifically stated otherwise, the sizes, materials, shapes, and relative positions of constituent elements described below are not intended to limit the scope of the present invention thereto but are intended to provide examples for illustration. Sizes or positional relations of members illustrated in the drawings may be exaggerated in order to clarify the descriptions. In the descriptions below, the same term or reference numeral generally represents the same member or members made of the same material, and its detailed description will be omitted as appropriate.

First Embodiment

FIG. 1A is a schematic plan view of a light-emitting device 100 according to a first embodiment.

Figure 1B:
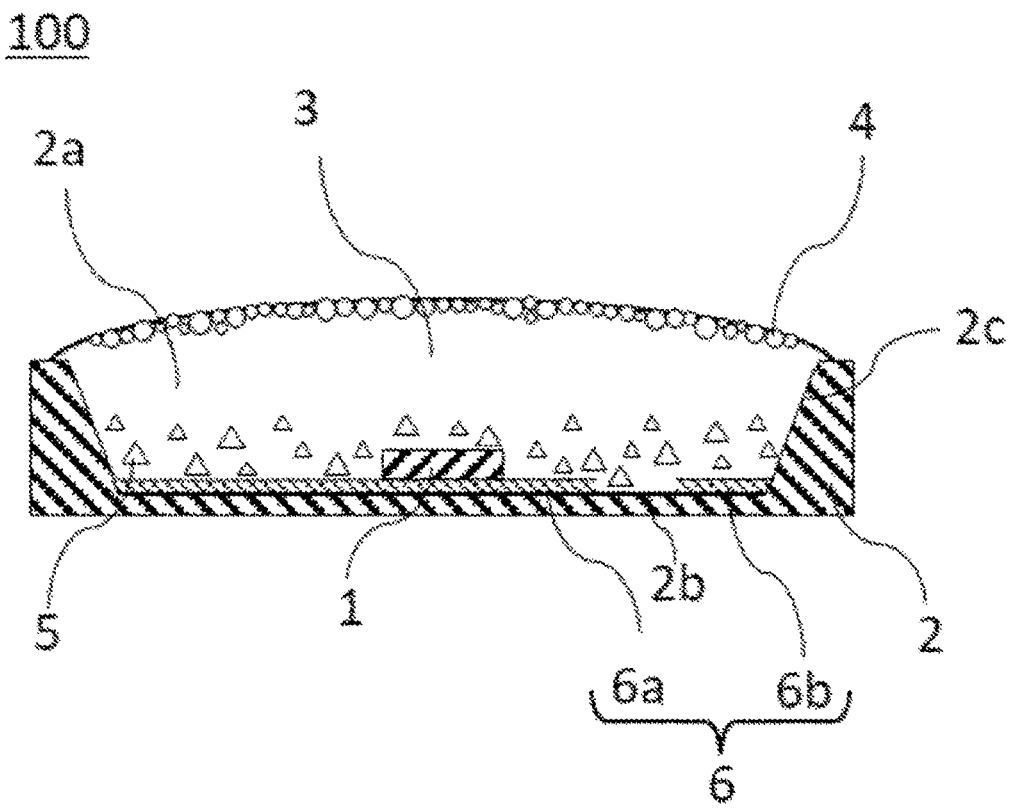
FIG. 1B is a schematic cross-sectional view of the light-emitting device according to the first embodiment taken along the line IB-IB of FIG. 1A.

FIG. 1B is a schematic cross-sectional view taken along the line IB-IB of FIG. 1A.

Figure 1C:
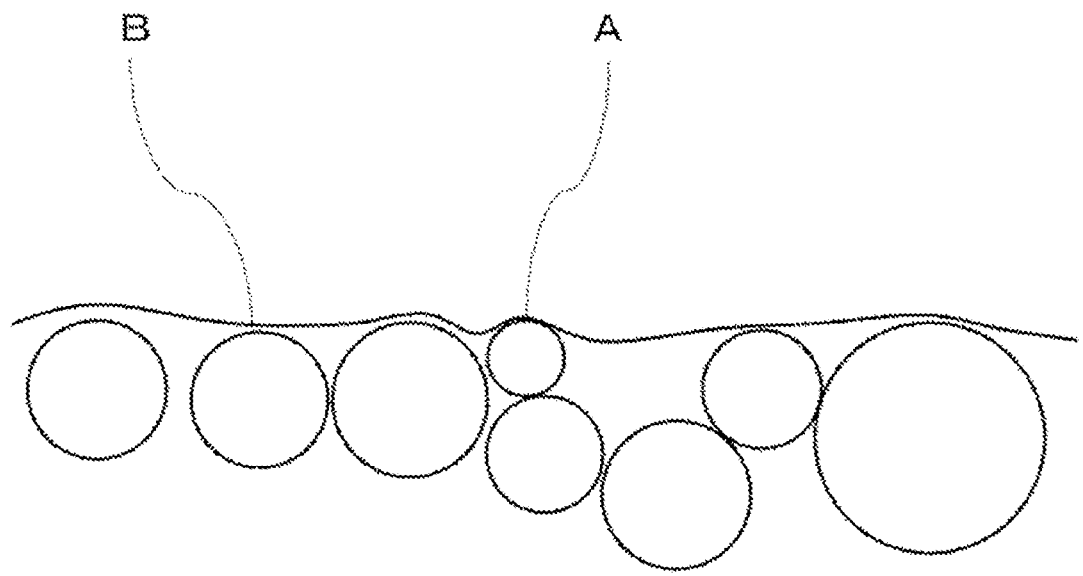
FIG. 1C is a schematic, enlarged, cross-sectional view of a first surface of a light-transmissive member in the light-emitting device according to the first embodiment shown in FIG. 1B.

FIG. 1C is a schematic, enlarged, cross-sectional view of a first surface of a light-transmissive member shown in FIG. 1B.

The light-emitting device 100 includes at least one light-emitting element 1, a light-transmissive member 3 covering the light-emitting element 1, and a light-diffusing agent 4 in the light-transmissive member 3. The light-diffusing agent 4 contains hollow particles, the light-transmissive member 3 has the first surface having irregularities attributable to the light-diffusing agent 4 and having a height gradually increased from a peripheral portion thereof to a central portion thereof. More specifically, the light-emitting device 100 includes a first in-process product 10, which includes a base member 2 having a recess 2a defined by an inner bottom surface 2b and lateral walls 2c and the light-emitting element 1 placed on or above the inner bottom surface 2b of the recess 2a, the light-transmissive member 3 covering the light-emitting element 1 and having a height gradually increased from the peripheral portion thereof to the central portion thereof, and the light-diffusing agent 4 and a phosphor 5 contained in the light-transmissive member 3. The light-diffusing agent 4 is located near the center and near the center of the convex shape in a plan view. The outer periphery of the convex shape is smooth in a cross-sectional view. The density of the phosphor 5 at the light-emitting element 1 in the light-transmissive member 3 is higher than the density of the phosphor 5 at the first surface of the light-transmissive member 3 in the light-transmissive member 3.

In a cross-sectional view, the light-transmissive member 3 has a convex shape protruding in which a thickness is increased from the peripheral portion toward the central portion thereof. This structure allows the light-diffusing agent 4 to gather at the center and near the center of the convex shape and allows for forming a smooth region including no light-diffusing agent 4 near the outer periphery of the convex shape. The hollow particles are therefore not located near the outer periphery of the convex shape, so that the adhesion to the inner lateral surfaces of the recess 2a can be enhanced. Components of the light emitting device will be described below.

First In-Process Product

The first in-process product 10 includes the base member 2 having the recess 2a defined by the inner bottom surface 2b and the lateral walls 2c, wirings 6 disposed on the inner bottom surface 2b of the recess 2a, and the light-emitting element 1 placed on or above the inner bottom surface 2b of the recess 2a and electrically connected to the wirings 6.

The lateral walls 2c are preferably inclined such that the recess 2a is wider toward the opening. The angle of inclination is preferably in the range of 900 to 150°, more preferably 1000 to 130°, with respect to the inner bottom surface 2b. With the inclination, the phosphor 5 contained in the light-transmissive member 3 is not easily seen in a plan view.

Light-Emitting Element

The light-emitting element 1 is mounted on or above the base member 2 in a face-up manner employing wire bonding using gold wires, silver wires, or aluminum wires, in a flip-chip manner using solder or silver paste, or the like. A single light-emitting element 1 may be mounted on or above the base member 2, or a plurality of light-emitting elements 1 may be mounted on or above the base member 2. Known elements can be used for the light-emitting element 1.

For example, a light-emitting diode or a laser diode is preferable. The light-emitting element 1 is electrically connected to the wiring 6 exposed on the inner bottom surface 2b of the recess 2a in the base member 2 and emits light in the wavelength range of ultraviolet to red. For example, for a blue or green light-emitting element 1, GaP or a nitride semiconductor represented by $In_xAl_yGa_{1-X-Y}N$, where $0 \leq X$, $0 \leq Y$, and $X+Y \leq 1$ may be used. For example, for a red light-emitting element 1, GaAlAs, AlInGaP, or the like can be used as well as a nitride semiconductor element. The light-emitting element 1 may have a polygonal shape, such as a square, an elongated rectangle, a triangle, or a hexagon, or a circular or elliptic shape, in a plan view.

Base Member

At least one light-emitting element 1 is mounted on or above the base member 2, and the base member 2 electrically connects the light-emitting device 100 to an external device. The base member 2 has the recess 2a defined by the inner bottom surface 2b and the lateral walls 2c and includes the wiring 6 located on the inner bottom surface 2b of the recess 2a and/or inside the base member 2. The base member 2 has a substantially square outer shape in a plan view. The base member 2 has the recess 2a that has a substantially square shape in a plan view. A material that has high mechanical strength and is less likely to transmit light emitted from the light-emitting element 1 and extraneous light is preferably used for a material of the base member 2. More specifically, the base member 2 may be made of a resin such as polyphthalamide resins (PPA), phenolic resins, bismaleimide-triazine resins (BT resins), epoxy resins, and silicone resins; a ceramic such as $Al_2O_3$ and AlN; or a metal such as copper, silver, gold, and aluminum. When the base member 2 is made of a metal, the base member 2 may be covered with an insulating material as appropriate.

The base member 2 may include, on a lower surface thereof, a heat dissipation terminal electrically independent of the light-emitting element 1. It is preferable that the heat dissipation terminal have an area larger than the sum of the areas of the upper surfaces of all light-emitting elements 1 included in the light-emitting device 100, and that the heat dissipation terminal overlap the region directly under the light-emitting elements 1. This structure of the heat dissipation terminal allows the light-emitting device 100 to have better heat dissipation performance. The color of the base member 2 may be white, which allows for obtaining good light extraction efficiency, but at least a portion of the upper surface of the package preferably has a dark color such as black, in order to reduce the reflectance of extraneous light, and may have irregularities to scatter extraneous light. The inner walls of the recess 2a may be in a dark color to enhance the display contrast, or the inner walls of the recess 2a may be white to enhance the light extraction efficiency.

Wiring

The wirings 6 includes positive and negative wirings 6a and 6b. The wirings 6 are exposed from the resin on the inner bottom surface 2b of the recess 2a and are arranged such that the upper surface of the wiring 6a is separated from the upper surface of the wiring 6b. The wirings 6 are formed by, for example, electroplating. The thickness of the wirings 6 may be uniform, or may be partially increased or reduced. The wiring 6 is preferably made of a material that has a high thermal conductivity and high mechanical strength and is easy to process by punching or etching. Examples of a material for the wiring 6 include metals such as copper, aluminum, gold, silver, tungsten, iron, and nickel and alloys such as iron-nickel alloys and phosphor bronze. The wirings 6 can alternatively be formed by using electroless plating, vacuum evaporation, sputtering, or other methods.

Light-Transmissive Member

The light-transmissive member 3 is disposed in the recess 2a and covers the light-emitting element 1. The light-transmissive member 3 contains the light-diffusing agent 4, and the first surface of the light-transmissive member 3 has irregularities formed by the light-diffusing agent 4. The light-transmissive member 3 also contains the phosphor 5.

The light-diffusing agent 4 is located closer to the first surface of the light-transmissive member 3 than the phosphor 5 is. With this arrangement, extraneous light such as sunlight or illumination light is reflected and dispersed by the light-diffusing agent 4 disposed on the first surface of the light-transmissive member 3, and thus is less likely to reach the phosphor 5 present at the light-emitting element 1 in the light-transmissive member 3, so that it is difficult to see the object color or the object reflection color of the phosphor 5. In other words, the object color of the light-emitting surface is white. The "first surface of the light-transmissive member 3" and the "first surface of the silicone resin" in the present specification refer to a surface of the light-transmissive member 3 and a surface of the silicone resin, respectively, opposite to the inner bottom surface 2b of the recess 2a. The "first surface of the light-transmissive member 3" basically refers to an upper surface of the light-transmissive member 3, and may further include a portion of each of the lateral surfaces of the light-transmissive member 3 continuous with the upper surface of the light-transmissive member 3. The "first surface of the silicone resin" basically refers to an upper surface of the silicone resin, and may further include a portion of each of the lateral surfaces of the silicone resin continuous with the upper surface of the silicone resin.

As shown in FIG. 1C, the first surface of the light-transmissive member 3 includes exposed portions A in which the light-diffusing agent 4 is exposed from the light-transmissive member 3 and covered portions B in which the light-transmissive member 3 covers the light-diffusing agent 4. The light-transmissive member 3 does not necessarily cover the whole light-diffusing agent 4.

The light-diffusing agent 4 is located at the first surface and/or near the first surface of the light-transmissive member 3 to allow the first surface of the light-transmissive member 3 to have irregularities. The light-transmissive member 3 is softer and more impact-resistant than the light-diffusing agent 4.

With this structure, the exposed portions A of the light-diffusing agent 4 is less likely to be damaged. In both of the exposed portions A and the covered portions B, at least a portion of the light-diffusing agent 4 is embedded in the light-transmissive member 3. With this structure, falling off or breakage of fine particles due to impact or the like is less likely to occur in the light-emitting device 100 according to the present embodiment than in a conventional light-emitting device in which fine particles are attached to the first surface of a silicone resin that has already been cured.

The light-transmissive member 3 is preferably made of a material with a good light-transmitting property, such as thermosetting resins and thermoplastic resins. Examples of thermosetting resins include silicone resins, modified silicone resins, silicone hybrid resins, epoxy resins, modified epoxy resins, urea resins, diallyl phthalate resins, phenolic resins, unsaturated polyester resins, and hybrid resins each containing one or more of these resins. In particular, silicone resins and modified or hybrid resins thereof have good resistance to heat and light, and therefore these resins are preferable. The light-transmissive member 3 has a transmittance of 50% or more, preferably 70% or more, more preferably 85% or more.

Light-Diffusing Agent

The light-diffusing agent 4 contains hollow particles. As shown in FIG. 1A, it is preferable that the light-diffusing agent 4 is uniformly disposed on the surface of the light-transmissive member 3. The distances among the particles and the degrees of exposure of the particles on the surface of the light-transmissive member 3 may be varied according to the size, shape, and other conditions of the hollow particles. The light-diffusing agent 4 is disposed such that at least a part of the light-diffusing agent 4 is exposed from the light-transmissive member 3 or such that the light-transmissive member 3 covers the light-diffusing agent 4. The hollow particles may have any appropriate particle size, but the particle size is preferably in the range of 5 μm to 100 μm, more preferably 20 μm to 70 μm, particularly preferably 45 μm to 65 μm. The particle size herein is expressed as the median diameter. The smaller the particle size and volume of the hollow particles are, the weaker the buoyancy becomes, and therefore the hollow particles are less likely to float up in the light-transmissive member 3. The hollow particles preferably have a shell thickness in the range of 1 μm to 30 μm, more preferably 5 μm to 20 μm. The larger the porosity of the hollow particles, the more easily the hollow particles can be float up, but the smaller the shell thickness of the hollow particles, which may easily cause damage to the fine particles. Accordingly, with the particle size and the shell thickness in the ranges as described above, the hollow particles can be easily floated up to the first surface of the light-transmissive member 3 and the fine particles can be hardly damaged. Thus, preferable irregularities can be formed on the first surface of the light-transmissive member 3, which can facilitate scattering of light on the first surface of the light-transmissive member 3 and preventing glare.

The bulk density or specific gravity of the light-diffusing agent 4 relative to the light-transmissive member 3 is preferably in the range of 0.1 g/cm$^3$ to 0.7 g/cm$^3$. The bulk density relative to the light-transmissive member 3 is more preferably in the range of 0.1 g/cm$^3$ to 0.2 g/cm$^3$. The smaller the bulk density relative to the light-transmissive member 3 is, the more easily the light-diffusing agent 4 floats up. With a too small bulk density of the light-diffusing agent 4, troubles such as floating up of the light-diffusing agent 4 during dispersing into the light-transmissive member 3 and uneven distribution in a dispenser may occur, resulting in impairment of the workability. With the bulk density in the above range, the light-diffusing agent 4 floats up to the first surface of the light-transmissive member 3 after the light-diffusing agent 4 is dispersed into the light-transmissive member 3. Irregularities are thus easily formed on the first surface of the light-transmissive member 3.

The particles of the light-diffusing agent 4 are preferably arranged in one layer to seven layers, more preferably two or three layers. Increase in the number of layers allows increase in reflection of light, so that the phosphor 5 is not easily seen, and allows diffusion of light to improve chromatic dispersion.

However, increase in number of the interfaces causes increase in the Fresnel reflection loss and thus luminous flux may be reduced. Accordingly, with the number of layers of the light-diffusing agent 4 in the above range, the phosphor 5 can be hardly seen and diffusion of light can be performed, so that decrease in luminous flux can be prevented.

The light-diffusing agent 4 preferably has a spherical shape. With the light-diffusing agent 4 having a spherical shape, a plurality of irregularities are likely to be evenly formed on the first surface of the light-transmissive member 3. The light-diffusing agent 4 may be white hollow fine particles, or transparent hollow fine particles that look white due to scattering caused due to difference in refractive index from the surrounding material. The light-diffusing agent 4 allows for scattering light emitted from the light-emitting element 1 and improving the light extraction efficiency of the light-emitting device 100. Accordingly, the light-diffusing agent 4 is preferably made of a material that greatly differs in refractive index from the light-transmissive member 3. Examples of a material for the light-diffusing agent 4 include micro powders such as hollow silica, hollow glass, hollow ceramic, fly ash, Shirasu balloons, hollow polymer, porous silica, and porous polymer. The light-diffusing agent 4 may be a powder containing two or more of these materials. For example, using a silicone resin having a refractive index of 1.50 to 1.55 for the light-transmissive member 3 and using hollow silica having a refractive index of 1.35 to 1.45 for the light-diffusing agent 4 allows for increasing light extraction efficiency of the light-emitting element 1 to the outside.

The amount of addition of the light-diffusing agent 4 to the light-transmissive member 3 is preferably in the range of 1.56 vol % to 19.3 vol %, more preferably 7.3 vol % to 10.6 vol %. The larger the amount of addition of the light-diffusing agent 4 is, the whiter the external appearance of the light-diffusing agent 4 viewed from the light-emitting surface becomes. If the amount of addition of the light-diffusing agent 4 is too large, transmittance may be decreased, which may lead to reduction in luminous intensity of the light-emitting device.

If the amount of addition is too small, the object color viewed from the surface of the light-transmissive member 3 becomes the object color of the phosphor 5. With the amount of addition of the light-diffusing agent 4 to the light-transmissive member 3 in the range as described above, the external appearance viewed from the light-emitting surface can be white without reducing luminous intensity of the light-emitting device. The unit "vol %" of the addition amount of the light-diffusing agent 4 refers to the volume of addition amount of the light-diffusing agent 4 with respect to the volume of the light-transmissive member 3 containing the light-diffusing agent 4, the phosphor 5, and other additives. For example, the expression "the amount of addition of the light-diffusing agent 4 is 10 vol %" refers to that the volume of the light-diffusing agent 4 relative to the total volume of 100 cm$^3$ including the volumes of the light-transmissive member 3, the light-diffusing agent 4, the phosphor 5, and other additives is 10 cm$^3$.

The light-transmissive member 3 may contain 0.01 vol % to 0.20 vol % or 0.02 vol % to 0.15 vol % of titanium oxide in addition to the light-diffusing agent 4 and the phosphor 5. The addition of titanium oxide allows the external appearance of the light-transmissive member 3 containing the light-diffusing agent 4 to be white, but may lead to great reduction in luminous flux of the light-emitting device. Accordingly, adding a small amount of titanium oxide and adding the light-diffusing agent 4 allow the external appearance of the light-transmissive member 3 to be white without reducing the luminous flux.

Phosphor

The phosphor 5 is adapted to absorb light emitted from the light-emitting element 1 and convert the light into light with a different wavelength. Examples of the phosphor 5 include cerium-activated yttrium-aluminum-garnet (YAG)-based phosphors; cerium-activated lutetium-aluminum-garnet (LAG)-based phosphors; europium- and/or chromium-activated nitrogen-containing calcium aluminosilicate (CaO—Al$_2$O$_3$—SiO$_2$)-based phosphors; europium-activated silicate ((Sr, Ba)$_2$SiO$_4$)-based phosphors; nitride-based phosphors such as β-SiAlON phosphors, CaAlSiN3:Eu (CASN)-based phosphors, and (Sr, Ca)AlSiN3:Eu (SCASN) phosphors; K$_2$SiF$_6$:Mn (KSF) phosphors; and sulfide-based phosphors. With such a phosphor, a light-emitting device that emits mixed light (such as white light) of primary light and secondary light, each having a wavelength of visible light, or a light-emitting device that emits visible secondary light through excitation by ultraviolet primary light can be provided. A plurality of types of phosphors 5 may be used in combination. Color rendering properties and color reproducibility can be adjusted by employing a combination or mixing ratio suitable to a desired color tone. The density of the phosphor 5 at the light-emitting element 1 side in the light-transmissive member 3 is preferably higher than the density of the phosphor 5 at the first surface side of the light-transmissive member 3 in the light-transmissive member 3. Increasing the density of the phosphor 5 at the light-emitting element 1 side allows for increasing the wavelength conversion ratio and reducing the addition amount of the phosphor 5 required to achieve a desired chromaticity.

In the light-emitting device 100 according to the present embodiment, the particle size, bulk density, amount of addition, and the like of the light-diffusing agent 4, which is added to the light-transmissive member 3 originally in order to control the light distribution, are adjusted appropriately to form irregularities on the first surface of the light-transmissive member 3. Thus, with the irregularities formed on the first surface of the light-transmissive member 3, extraneous light can be effectively scattered, and the color of the phosphor 5 can be less conspicuous. Also, a light-emitting device 100 with white external appearance when viewed from the light-emitting surface can be provided. In the case where a plurality of light-emitting elements 1 are included, the light-emitting elements are spaced apart from each other at a predetermined distance, and the light-diffusing agent 4 covers all the light-emitting elements 1 mounted in the light-emitting device 100 in a plan view. In addition, in the case where the base member 2 is white, the color of the base member 2 can be the same as the color of the first surface of the light-transmissive member 3, which is white. With this structure, the light-diffusing agent 4 scatters light emitted from the light-emitting elements 1 to reduce the difference in brightness in the ON state between the light-emitting portion including the light-emitting element 1 and the non-light-emitting portion including no light-emitting element, so that the light-emitting device 100 with reduced unevenness in luminance when mounted on a lighting fixture can be provided.

Manufacturing Method according to First Embodiment

Subsequently, a method of manufacturing the light-emitting device according to the first embodiment is described referring to FIG. 2 and FIGS. 3A to 3D. The order of some steps is not limited to the description below but may be changed.

Figure 2:
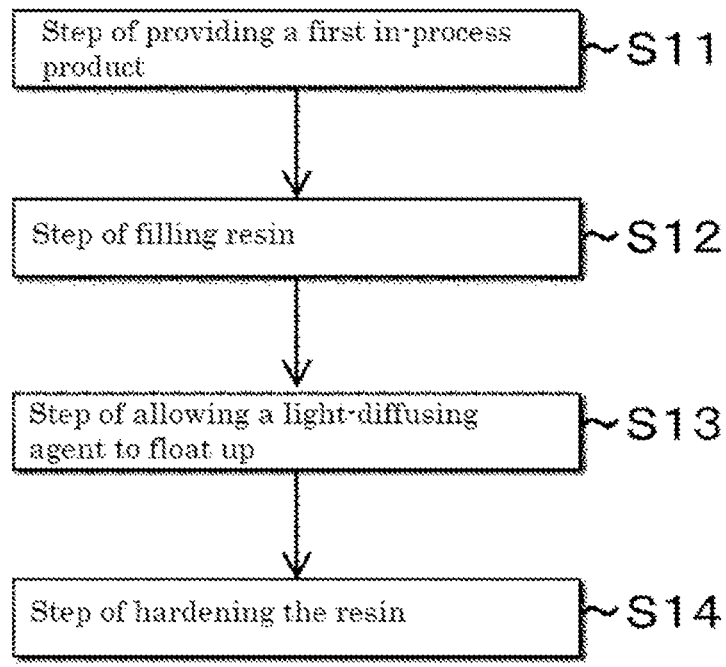
FIG. 2 is a flowchart illustrating a method of manufacturing the light-emitting device according to the first embodiment.

FIG. 2 is a flowchart illustrating the method of manufacturing the light-emitting device according to the first embodiment. The method of manufacturing the light-emitting device according to the first embodiment includes Step S11 of providing a first in-process product, Step S12 of injecting resin, Step S13 of allowing a light-diffusing agent to float up, and Step S14 of hardening the resin.

Figure 3A:
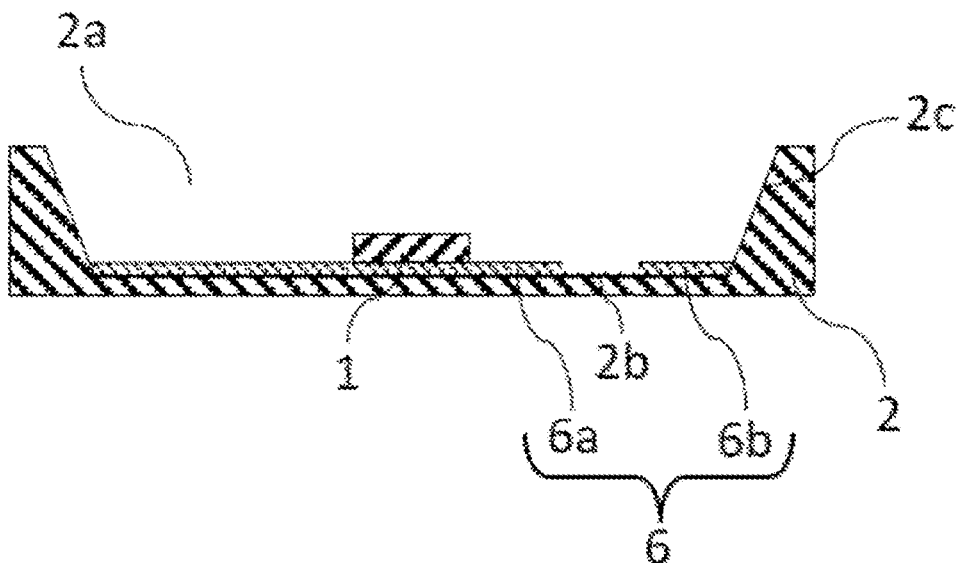
FIG. 3A is a schematic cross-sectional view for illustrating a step of providing a first in-process product in the method of manufacturing the light-emitting device according to the first embodiment.

FIG. 3A is a schematic cross-sectional view for illustrating the step of providing a first in-process product in the method of manufacturing the light-emitting device according to the first embodiment.

Figure 3B:
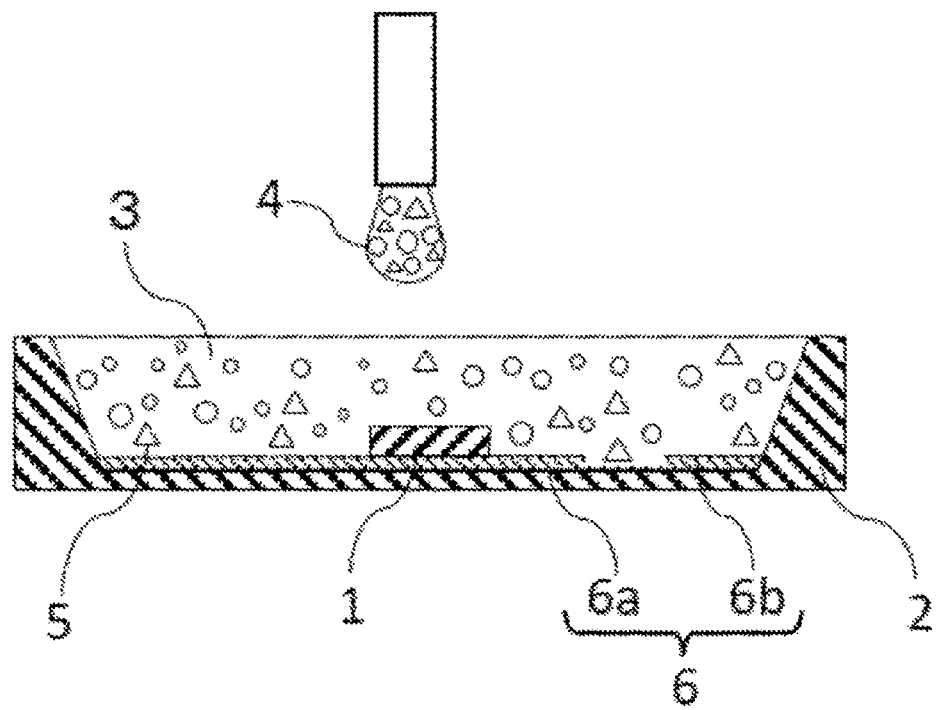
FIG. 3B is a schematic cross-sectional view for illustrating a step of filling resin in the method of manufacturing the light-emitting device according to the first embodiment.

FIG. 3B is a schematic cross-sectional view for illustrating the step of injecting resin in the method of manufacturing the light-emitting device according to the first embodiment.

Figure 3C:
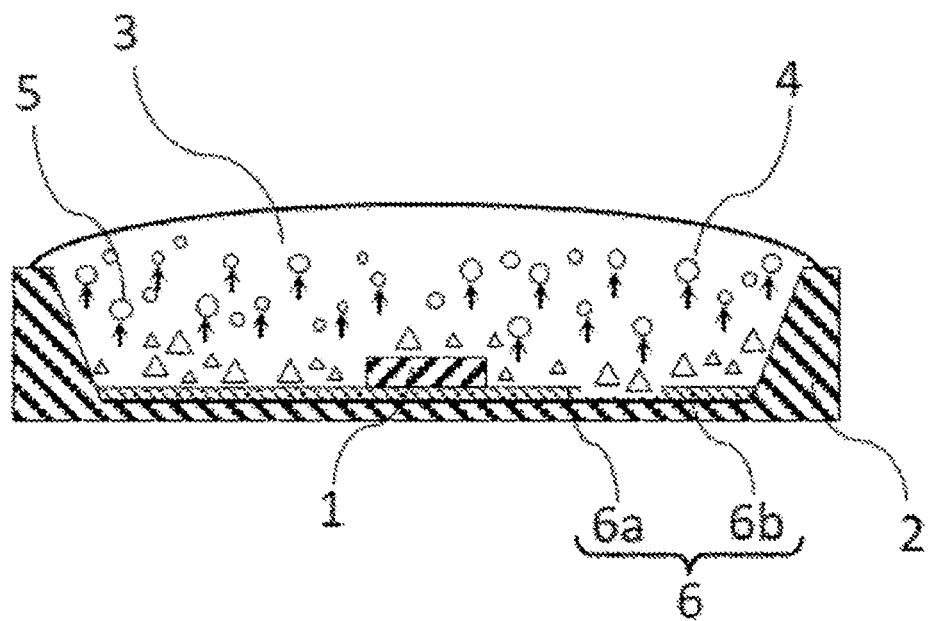
FIG. 3C is a schematic cross-sectional view for illustrating a step of allowing a light-diffusing agent to float up in the method of manufacturing the light-emitting device according to the first embodiment.

FIG. 3C is a schematic cross-sectional view for illustrating the step of allowing a light-diffusing agent to float up in the method of manufacturing the light-emitting device according to the first embodiment.

Figure 3D:
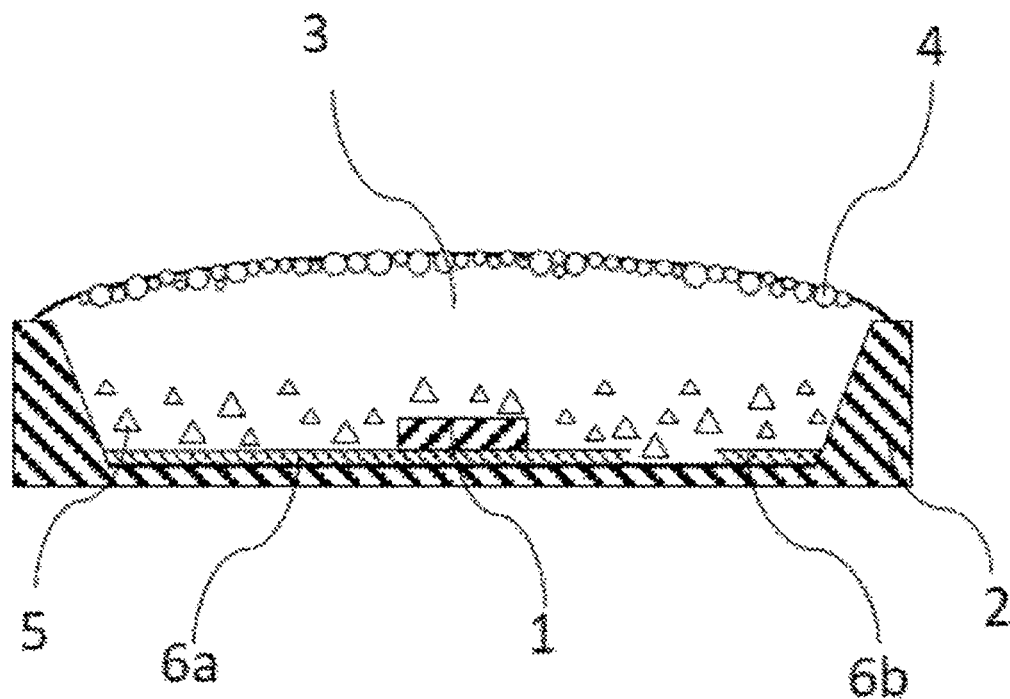
FIG. 3D is a schematic cross-sectional view for illustrating a step of hardening the resin in the method of manufacturing the light-emitting device according to the first embodiment.

FIG. 3D is a schematic cross-sectional view for illustrating the step of hardening the resin in the method of manufacturing the light-emitting device according to the first embodiment.

Providing First In-Process Product

The light-emitting element 1 is placed on or above the inner bottom surface 2b of the base member 2 defining the recess 2a.

As shown in FIG. 3A, in Step S11 of providing a first in-process product, the first in-process product 10 in which the light-emitting element 1 is placed on or above the inner bottom surface 2b of the base member 2 having the recess 2a defined by the inner bottom surface 2b and the lateral walls 2c is provided. In Step S11 of providing a first in-process product, the light-emitting element 1 is electrically connected to the wiring 6 on the base member 2 by wires or bumps.

Injecting Resin

The light-transmissive member 3 containing the light-diffusing agent 4 including the hollow particles is injected into the recess 2a. Hereinafter, a case in which a silicone resin is used for a material of the light-transmissive member 3 will be illustrated.

As shown in FIG. 3B, in Step S12 of injecting resin, a silicone resin to be the light-transmissive member 3 is injected and filled into the recess 2a of the base member 2. In Step S12 of injecting resin, the light-diffusing agent 4 has been added to a silicone resin, and the light-diffusing agent 4 is uniformly dispersed in the silicone resin. The silicone resin is dropped into the recess 2a of the base member 2 by using, for example, a potting technique with the use of a dispenser.

As shown in FIG. 3B, in Step S12 of injecting resin, the silicone resin containing the light-diffusing agent 4 is filled until the silicone resin forms a convex shape in which the central portion thereof is thicker than the peripheral portion thereof, with the uppermost portion of the convex shape located at the center or near the center of the recess 2a in a plan view. Using the light-diffusing agent 4 with a predetermined particle size, bulk density, and amount of addition allows the light-diffusing agent 4 to float up to a first surface and/or the vicinity of the first surface of the silicone resin in Step S13, which is a subsequent step.

Allowing Light-diffusing agent to Float Up

The hollow particles are allowed to float up to the first surface of the injected light-transmissive member 3, and the light-transmissive member 3 is formed into a convex shape.

As shown in FIG. 3C, in Step S13 of allowing a light-diffusing agent to float up, the light-diffusing agent 4 is allowed to float up to the first surface of the silicone resin. In Step S13 of allowing a light-diffusing agent to float up, the silicone resin in which the light-diffusing agent 4 is uniformly dispersed is left at 40° C. for 12 hours. The light-diffusing agent 4 is lighter than the silicone resin, and the adjustment of the particle size and the like has been performed as described above.

Therefore, the light-diffusing agent 4 gradually floats up in the unhardened silicone resin (see the arrows in FIG. 3C) with time, so that the light-diffusing agent 4 floats at the first surface and/or in the vicinity of the first surface of the silicone resin. Irregularities according to the shape of the light-diffusing agent 4 are thus formed on the first surface of the silicone resin.

The floating up of the hollow particles may be performed by allowing the light-transmissive member 3 containing the hollow particles to be left for a predetermined time or by applying vibration such as ultrasonic waves. Applying ultrasonic waves to the light-transmissive member 3 allows the hollow particles float up quickly and uniformly; however, the convex shape of the light-transmissive member 3 may be made flatten.

Hardening Resin

The light-transmissive member 3 is hardened.

As shown in FIG. 3D, in Step S14 of hardening the resin, the silicone resin is hardened. In Step S14 of hardening the resin, the silicone resin is heated at 150° C. for 4 hours. Hardening the silicone resin by heat allows the light-diffusing agent 4, which has floated up to the first surface and/or the vicinity of the first surface of the silicone resin, to be fixed at the first surface and/or the vicinity of the first surface of the silicone resin, so that irregularities are formed on the first surface of the silicone resin. The temperature in the heating is preferably adjusted to a temperature around 150° C. in order to form the irregularities for scattering extraneous light on the first surface of the silicone resin.

The light-emitting device 100 is manufactured through the above-described steps. The above steps have been described referring to a single light-emitting device 100, but a plurality of light-emitting devices 100 connected to each other through the base members 2 may be formed at once and then separated to provide individual light-emitting devices 100.

In the method of manufacturing the light-emitting device according to the first embodiment, the particle size, bulk density, amount of addition, and the like are adjusted as appropriate to make the light-diffusing agent 4 float up to the first surface and/or the vicinity of the first surface of the silicone resin, so that irregularities according to the light-diffusing agent 4 are formed on the surface of the silicone resin. This allows for providing a light-emitting device having a white external appearance viewed from the light-emitting surface. Further, at least a portion of the light-diffusing agent 4 is embedded in the silicone resin, so that a light-emitting device in which the light-diffusing agent 4 will not be damaged by impact or the like can be formed.

Second Embodiment

Figure 4A:
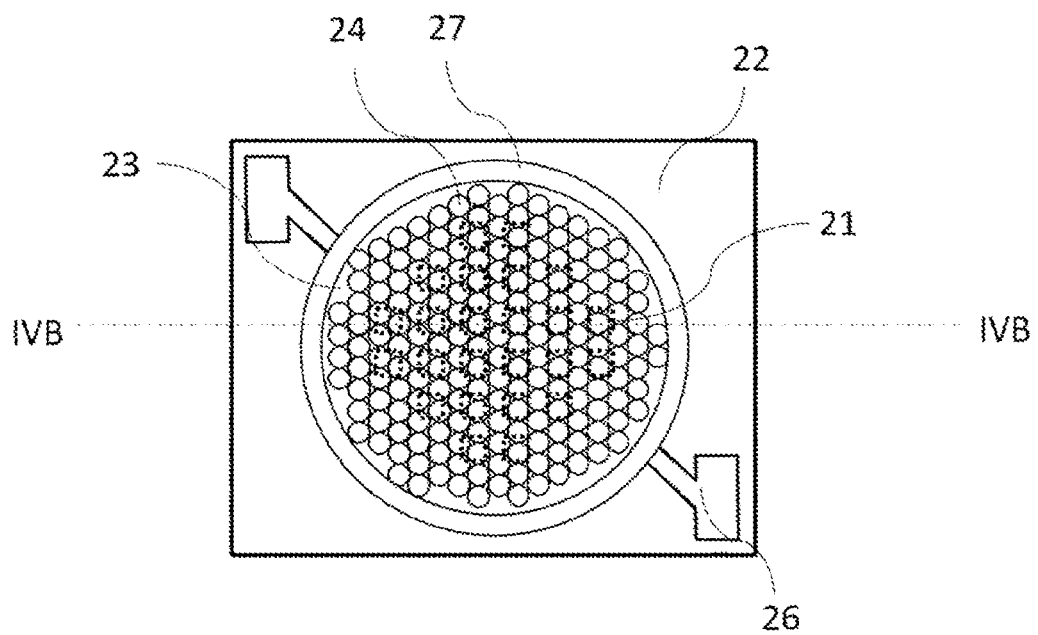
FIG. 4A is a schematic plan view of a light-emitting device according to a second embodiment.

FIG. 4A is a schematic plan view of a light-emitting device 200 according to the present embodiment.

Figure 4B:
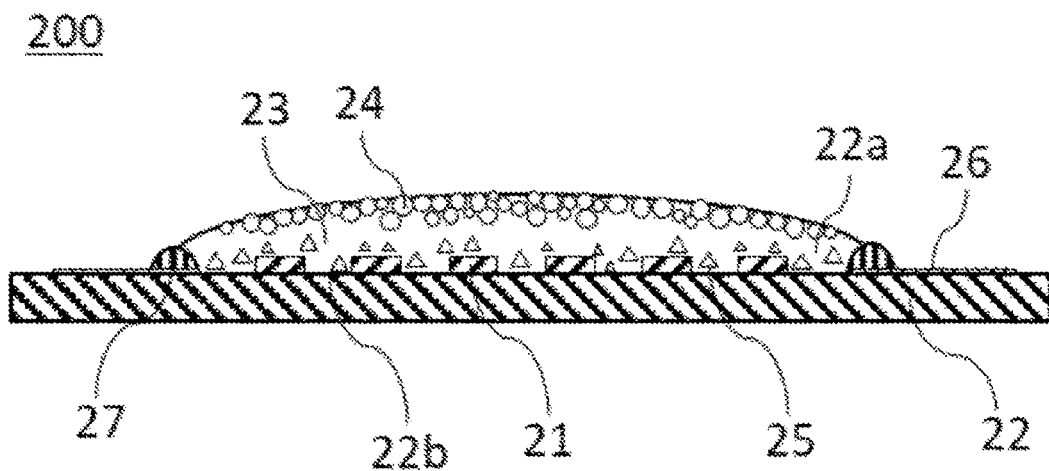
FIG. 4B is a schematic cross-sectional view of the light-emitting device according to the second embodiment taken along the line IVB-IVB of FIG. 4A.

FIG. 4B is a schematic cross-sectional view taken along the line IVB-IVB of FIG. 4A.

Figure 4C:
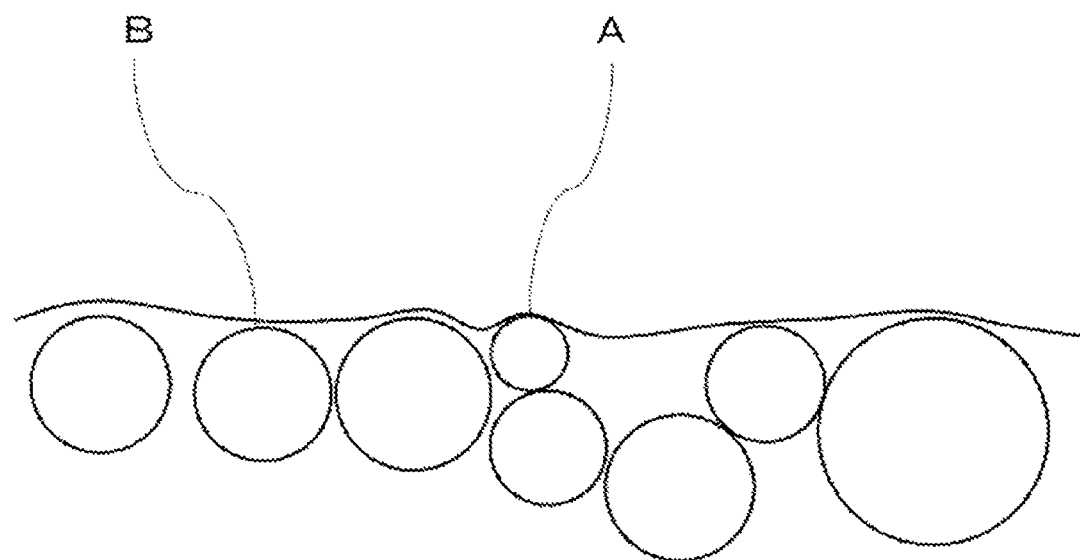
FIG. 4C is a schematic, enlarged, cross-sectional view of the first surface of a light-transmissive member in the light-emitting device according to the second embodiment shown in FIG. 4B.

FIG. 4C is a schematic, enlarged, cross-sectional view of a first surface of a light-transmissive member shown in FIG. 4B.

The light-emitting device 200 includes a second in-process product 20 that includes a plate-like base member 22, one or more light-emitting elements 21 placed on or above the base member 22, and a protruding part 27 annularly surrounding the light-emitting elements 21; a light-transmissive member 23 covering the light-emitting elements 21 and having a convex shape in which a thickness gradually increases from a peripheral portion thereof toward a central portion thereof; and a light-diffusing agent 24 and a phosphor 25 contained in the light-transmissive member 23. The light-diffusing agent 24 includes hollow particles, and irregularities according to the light-diffusing agent 24 are formed on the first surface of the light-transmissive member 23. The light-diffusing agent 24 is located near the center of the convex shape in a plan view.

The outer periphery of the convex shape is substantially smooth in a cross-sectional view. The density of the phosphor 25 at the light-emitting elements 21 side in the light-transmissive member 23 is higher than the density of the phosphor 25 at the first surface of the light-transmissive member 23 in the light-transmissive member 23.

With the convex shape of the light-transmissive member 23 in which a thickness is gradually increased from the peripheral portion toward the central portion, the light-diffusing agent 24 can be gathered near the center of the convex shape, and the light-transmissive member 23 can have a smooth region including no light-diffusing agent 24 near the outer periphery of the convex shape. The hollow particles are therefore not located near the outer periphery of the convex shape, so that the adhesive strength of the light-transmissive member 23 to the protruding part 27 can be enhanced. Configurations of the light-emitting device 200 will be described below. The light-emitting elements 21, the light-diffusing agent 24, the phosphor 25, and wiring 26 are substantially the same as in the first embodiment, and their descriptions are therefore omitted.

Second In-Process Product

The second in-process product 20 includes the plate-like base member 22, the light-emitting elements 21 placed on or above the base member 22, and the protruding part 27 annularly surrounding the light-emitting elements 21, and a recess 22a is defined by the base member 22 and the protrusion 27. A plurality of light-emitting elements 21 may be provided, and the protruding part 27 may surround the light-emitting elements 21.

Base Member

At least one light-emitting element 21 is mounted on the base member 22, and the base member 22 electrically connects the light-emitting device 200 to an external device. The base member 22 is a plate and includes the wiring 26 on the surface of and/or inside the base member 22. The base member 22 has a substantially square outer shape in a plan view. A material similar to a material used for the base member 2 can be used for the base member 22. Similarly to the base member 2, the base member 22 has a lower surface, and may include, on the lower surface of the base member 22, a heat dissipation terminal electrically independent of the light-emitting elements 21.

Protruding Part

An insulating material that is less likely to transmit light emitted from the light-emitting elements 21 and extraneous light is preferably used for the protruding part 27. A material with predetermined strength is preferably used for the protruding part 27. Specific examples of the protruding part 27 include ceramics such as alumina, aluminum nitride, and mullite, and resins such as phenolic resins, epoxy resins, silicone resins, polyimide resins, bismaleimide-triazine resins (BT resins), polyphthalamide (PPA), polyamides (PA), and unsaturated polyesters. The protruding part 27 may have any appropriate height.

The height of the protruding part 27 is in the range of 0.1 mm to 5 mm, preferably 0.3 mm to 2 mm.

Light-Transmissive Member

The light-transmissive member 23 is disposed in the recess 22a and covers the light-emitting elements 21. The light-transmissive member 23 contains the light-diffusing agent 24, and the first surface of the light-transmissive member 23 has irregularities according to the light-diffusing agent 24. The light-transmissive member 23 also contains the phosphor 25.

The light-diffusing agent 24 is located closer to the first surface of the light-transmissive member 23 than the phosphor 25 is. With this arrangement, the light-diffusing agent 24 present on the surface of the light-transmissive member 23 reflects and diffuses the extraneous light, which allows extraneous light emitted from the sun and lighting device to be less likely to reach the phosphor 25 present at the light-emitting elements 21 in the light-transmissive member 23, so that it becomes difficult to see the object color or the object reflection color of the phosphor 25. In other words, the object color of the light-emitting surface becomes white. The "first surface of the light-transmissive member 23" refers to a surface of the light-transmissive member 23 opposite to a surface thereof facing a surface of the base member 22.

The "first surface of the light-transmissive member 23" refers to an upper surface of the light-transmissive member 23, and may further include a portion of each of the lateral surfaces of the light-transmissive member 23 continuous with the upper surface of the light-transmissive member 23.

Method of Manufacturing according to Second Embodiment

Subsequently, a method of manufacturing the light-emitting device according to the second embodiment will be described referring to FIG. 5 and FIGS. 6A to 6E. The order of some steps is not limited to the description below but may be changed.

Figure 5:
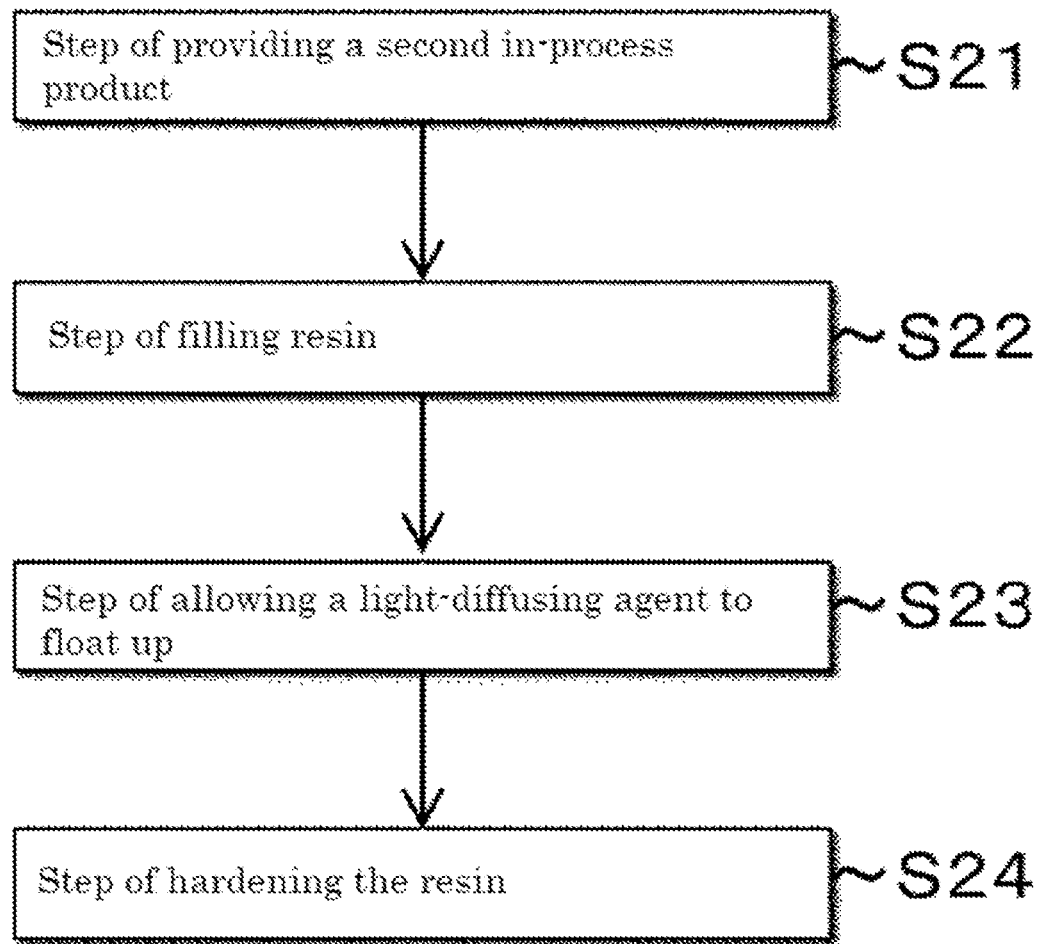
FIG. 5 is a flowchart illustrating a method of manufacturing the light-emitting device according to the second embodiment.

FIG. 5 is a flowchart illustrating the method of manufacturing the light-emitting device according to the second embodiment. The method of manufacturing the light-emitting device according to the second embodiment includes Step S21 of providing a second in-process product, Step S22 of injecting resin, Step S23 of allowing a light-diffusing agent to float up, and Step S24 of hardening the resin.

Figure 6A:
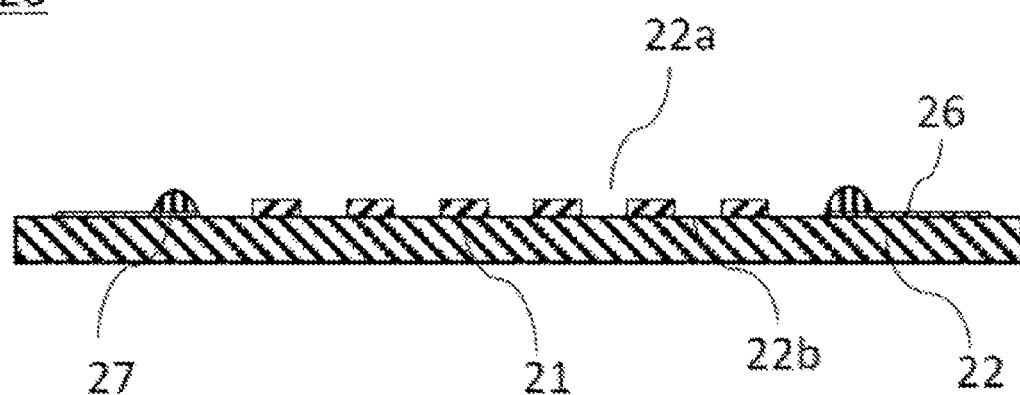
FIG. 6A is a schematic cross-sectional view for illustrating a step of providing a second in-process product in the method of manufacturing the light-emitting device according to the second embodiment.

FIG. 6A is a schematic cross-sectional view for illustrating the step of providing a second in-process product in the method of manufacturing the light-emitting device according to the second embodiment.

Figure 6B:
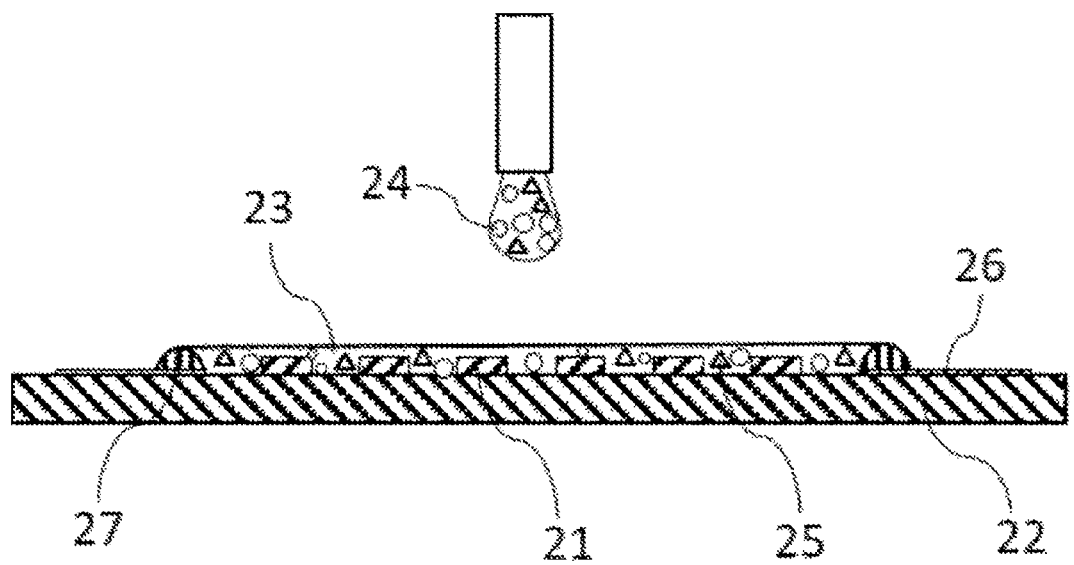
FIG. 6B is a schematic cross-sectional view for illustrating a step of filling resin in the method of manufacturing the light-emitting device according to the second embodiment.
Figure 6C:
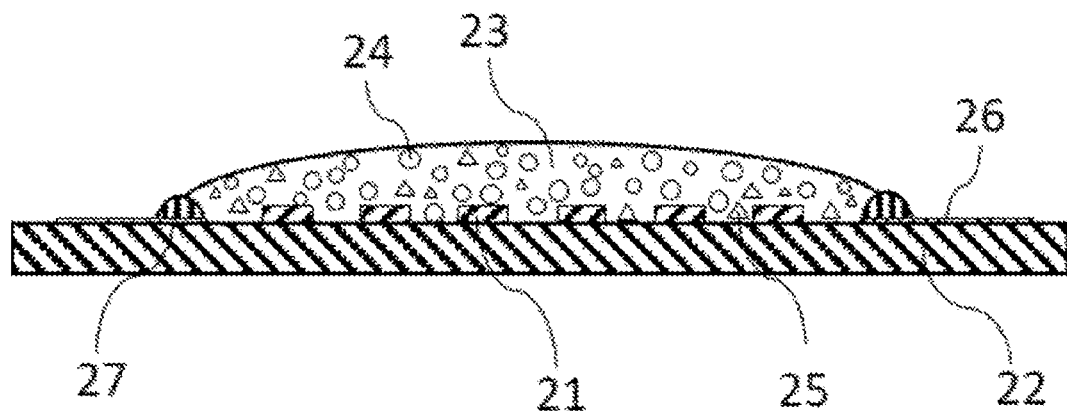
FIG. 6C is a schematic cross-sectional view for illustrating the step of filling resin in the method of manufacturing the light-emitting device according to the second embodiment.
Figure 6D:
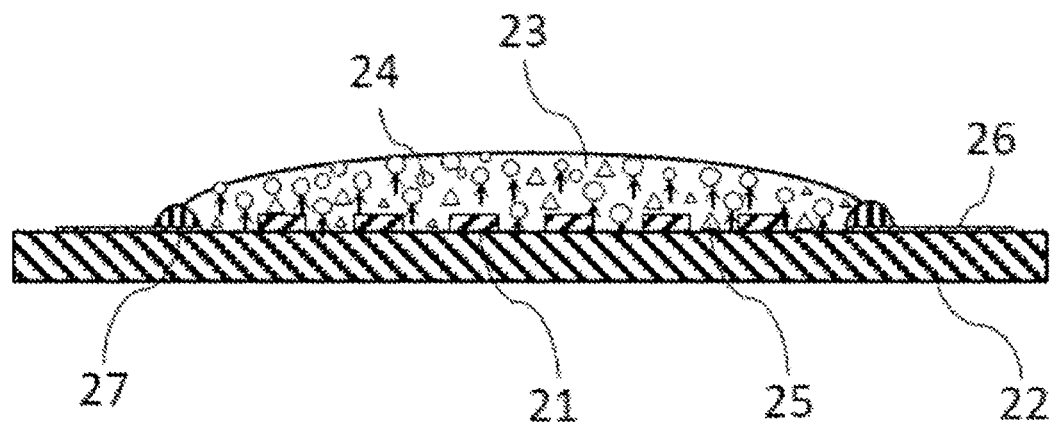
FIG. 6D is a schematic cross-sectional view for illustrating a step of allowing a light-diffusing agent to float up in the method of manufacturing the light-emitting device according to the second embodiment.

FIG. 6B and FIG. 6C are schematic cross-sectional views for illustrating the step of injecting resin in the method of manufacturing the light-emitting device according to the second embodiment. FIG. 6D is a schematic cross-sectional view for illustrating the step of allowing a light-diffusing agent to float up in the method of manufacturing the light-emitting device according to the second embodiment.

Figure 6E:
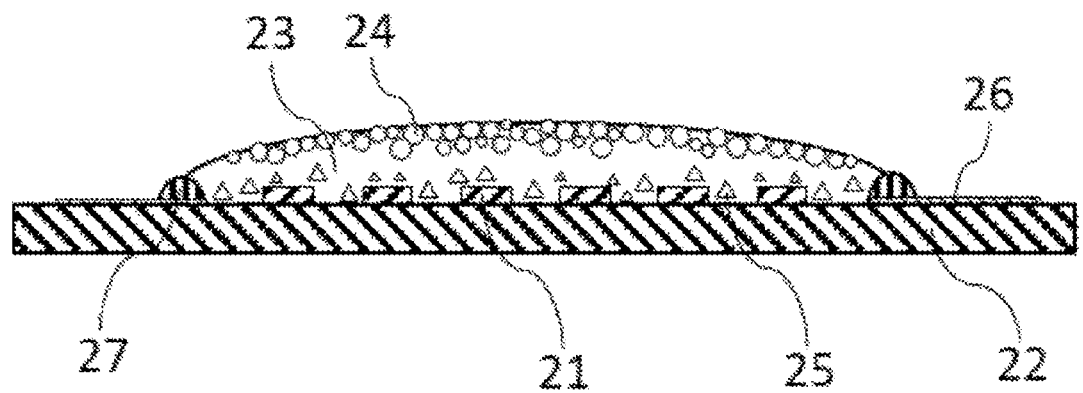
FIG. 6E is a schematic cross-sectional view for illustrating a step of hardening the resin in the method of manufacturing the light-emitting device according to the second embodiment.

FIG. 6E is a schematic cross-sectional view for illustrating the step of hardening the resin in the method of manufacturing the light-emitting device according to the second embodiment.

Providing Second In-Process Product

The second in-process product 20, in which the light-emitting elements 21 are placed on or above the plate-like base member 22 and the annular protrusion 27 surrounds the light-emitting elements 21, is provided.

As shown in FIG. 6A, in Step S21 of providing a second in-process product, the second in-process product 20, which includes the plate-like base member 22, the light-emitting elements 21 placed on or above the plate-like base member 22, and the annular protrusion 27 surrounding the light-emitting elements 21, is provided. In Step S21 of providing a second in-process product, the light-emitting elements 21 are electrically connected to the wiring 26 on the base member 22 by wires or bumps.

Injecting Resin

The light-transmissive member 23 containing at least the light-diffusing agent 24 including the hollow particles is injected into the inside of the protrusion 27 to form the convex shape in which a thickness is gradually increased from the peripheral portion thereof toward the central portion thereof. Hereinafter, a case in which a silicone resin is used for a material of the light-transmissive member 3 will be illustrated.

As shown in FIG. 6B, in Step S22 of injecting resin, a silicone resin to be the light-transmissive member 23 is injected and filled into the recess 22a. In Step S22 of injecting resin, the light-diffusing agent 24 has been added to a silicone resin, and the light-diffusing agent 24 is uniformly dispersed in the silicone resin. The silicone resin is dropped into the recess 22a by, for example, potting using a dispenser.

As shown in FIG. 6C, in Step S22 of injecting resin, the silicone resin containing the light-diffusing agent 24 is filled until the silicone resin forms a convex shape having a thickness gradually increased from the peripheral portion thereof toward the central portion thereof, with an uppermost portion of the silicone resin located at the center or near the center of the recess 22a in a plan view. With the light-diffusing agent 24 having a predetermined particle size, bulk density, and addition amount, the light-diffusing agent 24 can float up to the first surface and/or the vicinity of the first surface of the silicone resin in Step S23, which is the subsequent step.

Allowing Light-diffusing agent to Float Up

The hollow particles are allowed to float up to the first surface of the light-transmissive member 23.

As shown in FIG. 6D, in Step S23 of allowing a light-diffusing agent to float up, the light-diffusing agent 24 is allowed to float up to the first surface of the silicone resin. In Step S23 of allowing a light-diffusing agent to float up, the silicone resin in which the light-diffusing agent 24 is uniformly dispersed is left at 40° C. for 12 hours. The light-diffusing agent 24 is lighter than the silicone resin, and the adjustment of the particle size and the like has been performed as described above.

Therefore, the light-diffusing agent 24 gradually floats up in the unhardened silicone resin (see the arrows in FIG. 6D) with time, so that the light-diffusing agent 24 floats at the first surface and/or the vicinity of the first surface of the silicone resin. Irregularities according to the shape of the light-diffusing agent 24 are thus formed on the first surface of the silicone resin.

Hardening Resin

The light-transmissive member 23 is hardened. As shown in FIG. 6E, in Step S24 of hardening the resin, the silicone resin is hardened. In Step S24 of hardening the resin, the silicone resin is heated at 150° C. for 4 hours. Hardening the silicone resin by heat allows the light-diffusing agent 24, which has floated up to the first surface and/or the vicinity of the first surface of the silicone resin, to be fixed at the first surface and/or in the vicinity of the first surface of the silicone resin, so that irregularities are formed on the first surface of the silicone resin. The temperature in the heating is preferably adjusted to a temperature around 150° C. in order to form the irregularities for scattering extraneous light on the first surface of the silicone resin.

The light-emitting device 200 is manufactured through the above steps. The above steps have been described referring to a single light-emitting device 200, but a plurality of light-emitting devices 200 connected to each other through the base members 22 may be formed at once and then may be separated to provide individual light-emitting devices 200.

In the method of manufacturing the light-emitting device according to the second embodiment, the particle size, bulk density, amount of addition, and the like are adjusted as appropriate to allow the light-diffusing agent 24 to float up to the first surface and/or the vicinity of the first surface of the silicone resin, so that irregularities according to the light-diffusing agent 24 are formed on the first surface of the silicone resin. Thus, a light-emitting device having a white external appearance of the light-emitting surface can be obtained. Further, at least a portion of the light-diffusing agent 24 is embedded in the silicone resin, the light-emitting device 200 in which the light-diffusing agent 24 will not be damaged by impact or the like can be obtained.

Certain examples of the light-emitting device according to the present disclosure will be described below. The light-emitting device according to the present disclosure is not limited to the examples below.

EXAMPLE 1 to EXAMPLE 5

Light-emitting devices were produced using the method of manufacturing the light-emitting device according to the second embodiment.

In the light-emitting device of Example 1, the particle size of the light-diffusing agent was 65 μm. In the light-emitting device of Example 2, the particle size of the light-diffusing agent was 55 μm. In the light-emitting device of Example 3, the particle size of the light-diffusing agent was 45 μm. In the light-emitting device of Example 4, the particle size of the light-diffusing agent was 35 μm. In the light-emitting device of Example 5, the particle size of the light-diffusing agent was 20 μm. In order that the light-emitting devices of Example 1 to Example 5 have the same emission color, a phosphor was further added so that an emission color of 5000 K at chromaticity coordinates (0.328, 0.342) was obtained.

Constituent elements of Example 1 to Example 5 are more specifically described below.

Light-emitting element
  Number: 24 light emitting elements are mounted
  Type: configured to emit blue light with a peak emission wavelength of 455 nm
  Outer dimensions in a plan view: a square with each side of 0.65 mm (length×width)
  Height: 150 μm
Base Member
  Material: ceramic
  Outer dimensions in a plan view: a square with each side of 15 mm (length×width)
  Inner dimensions in a plan view: a square with side of 12 mm (length×width)
  Height: 2.0 mm
  Shape: substantially rectangular prism shape
Light-transmissive member
  Material: methyl silicone resin (product name: OE-6351, manufactured by "Dow Coming Toray Co., Ltd.")
  Outer dimensions in a plan view: a circle of 7 mm in diameter
  Thickness: 850 μm at the central portion
  Hardening condition: at 40° C. for 12 hr., and at 150° C. for 4 hr.
Light-diffusing agent
  Type: hollow filler
  Addition amount of addition: 10.6 vol % relative to the total volume of the transmissive member, the phosphor, and the light-diffusing agent
  Shape: sphere
Protruding part
  Material: methyl silicone resin containing a white pigment outer dimensions in a plan view: a circle of 7 mm in diameter
  Thickness: 500 μm
  Hardening condition: at 150° C. for 15 min.

COMPARATIVE EXAMPLE 1

A light-emitting device according to a comparative example was produced for comparison with the light-emitting devices according to the Example 1 to Example 5. In the light-emitting device of Comparative Example 1, the light-diffusing agent was not added to the light-transmissive member. The structure was the same as the structure of Example 1 except for the addition amount of the light-diffusing agent to the light-transmissive member. Details of constituent elements of Comparative Example 1 are as described above. In Table 1 below, columns of the particle size (μm) and the specific gravity (g/cm$^3$) of Comparative Example 1 are left blank because the light-diffusing agent was not added to the light-transmissive member in the light-emitting device of Comparative Example 1.

The experiments as described below were conducted on Example 1 to Example 5 and Comparative Example 1.

The object colors of Example 1 to Example 5 and Comparative Example 1 were measured using a fast spectrophotometric colorimeter (product name: "CMS-35PS", manufactured by Murakami Color Research Laboratory Co., Ltd.).

Differences in heights of the irregularities on the light-emitting surfaces of the light-emitting devices of Example 1 to Example 5 were measured using a stylus thickness meter (product name: "Alpha-Step IQ", manufactured by Yamato Scientific Co., Ltd.).

Table 1 shows the evaluation results.

Table 1 shows the amounts of addition (vol %), particle sizes (μm), specific gravities (g/cm$^3$), object colors (x, y), luminous fluxes (%), difference in heights of the irregularities (μm), and number of layers of the particles, of Example 1 to Example 5 and Comparative Example 1. The "difference in heights of the irregularities" refers to the surface roughness of the light-emitting surface of the light-transmissive member.

TABLE 1

| | Addition amount (vol %) | Particle size (μm) | Specific gravity (g/cm$^3$) | Object color (x, y) | Luminous flux (%) | Difference in heights of the irregularities (μm) | Number of layers of particles |
|---|---|---|---|---|---|---|---|
| Example 1 | 10.6 | 65 | 0.13 | (0.377, 0.432) | 95.2 | 1.0 | 3 |
| Example 2 | 10.6 | 55 | 0.25 | (0.365, 0.416) | 84.3 | 1.2 | 4 |
| Example 3 | 10.6 | 45 | 0.37 | (0.362, 0.410) | 89.8 | 1.2 | 4 |
| Example 4 | 10.6 | 35 | 0.22 | (0.366, 0.416) | 77.6 | 1.2 | 6 |
| Example 5 | 10.6 | 20 | 0.46 | (0.352, 0.392) | 79.2 | 0.8 | 7 |
| Comparative Example 1 | 0 | | | (0.430, 0.511) | 100 | 0 | 0 |

The chromaticity coordinates of the object colors were (0.377, 0.432) in Example 1 and (0.430, 0.511) in Comparative Example 1. In other words, in Comparative Example 1, the emission color was white, but the object color was yellow. This is because the color of the phosphor was seen. On the other hand, in Example 1, both of the emission color and the object color were white.

Also in Example 2 to Example 5 in which the particle sizes of the light-diffusing agent were different, both of the emission colors and the object colors were white. In other words, adding a hollow light-diffusing agent having a particle size of 20 μm or more with difference in the specific gravity of 0.65 or more from the light-transmissive member allows for obtaining the light-emitting device with a white object color.

Accordingly, the light-emitting device in which the light-diffusing agent is added to the light-transmissive member and the light-emitting device in which no light-diffusing agent is added to the light-transmissive member have the same emission color even though having different colors of external appearance. In other words, the hollow structure of the light-diffusing agent located above the phosphor, which is present at the bottom surface of the light-transmissive member, can scatter extraneous light.

The difference in height of a surface of the light-emitting device was 0 μm in Comparative Example 1, while irregularities were observed in Example 1 to Example 5. In other words, adding the light-diffusing agent with a particle size in the range of 20 μm to 70 μm allows for forming irregularities according to the light-diffusing agent on the first surface of the light-transmissive member. The irregularities can efficiently scatter extraneous light and light emitted from the light-emitting devices incident on a surface of the light-emitting device and suppress glare.

In the light-emitting device of Comparative Example 1 in which no light-diffusing agent was added to the light-transmissive member, when the light-emitting device was turned on, the difference in brightness between the light-emitting portions, which included the light-emitting elements, and the non-light-emitting portions, which included no light-emitting element, was conspicuous.

In each of the light-emitting devices of Examples 1 to 5 in which the light-diffusing agent was added to the light-transmissive member, when the light-emitting device was turned on, the difference in brightness between the light-emitting portions and the non-light-emitting portions was not conspicuous due to scattering of light by the light-diffusing agent. That is, with the layer of the light-diffusing agent disposed on the first surface of the light-transmissive member, unevenness in luminance of the light-emitting device when the light-emitting device is turned on can be reduced.

EXAMPLE 6 to EXAMPLE 8

Light-emitting devices were produced in accordance with the method of manufacturing the light-emitting device according to the second embodiment. In the light-emitting device according to Example 6, the addition amount of titanium oxide was 0.02 vol %. In the light-emitting device according to Example 7, the addition amount of titanium oxide was 0.05 vol %. In the light-emitting device according to Example 8, the addition amount of titanium oxide was 0.11 vol %.

The light emitting device in each of Example 6 to Example 8 is the same as the light emitting device in Example 1 except for the addition amount of titanium oxide.

COMPARATIVE EXAMPLE 2

A light-emitting device according to Comparative Example 2 was produced for comparison with the light-emitting device according to Example 6. In the light-emitting device of Comparative Example 2, the addition amount of titanium oxide was 0.38 vol %. The light-emitting device of Comparative Example 2 was the same as the light-emitting device of Example 1 except for the addition amount of the light-diffusing agent in a sealing member. Details of constituent elements of Comparative Example 2 are as described above.

Table 2 shows the evaluation results.

Table 2 shows the addition amount of the hollow filler (vol %), particle size of the hollow filler (μm), specific gravity of the hollow filler (g/cm$^3$), amount of addition of titanium oxide (vol %), object color (x, y), and luminous flux (%) in each of Example 1, Example 6 to Example 8, Comparative Example 1, and Comparative Example 2.

TABLE 2

|  | Addition amount of hollow filler (vol %) | Particle size of hollow filler (μm) | Specific gravity of hollow filler (g/cm$^3$) | Addition amount of titanium oxide (vol %) | Object color (x, y) | Luminous flux (%) |
| --- | --- | --- | --- | --- | --- | --- |
| Example 1 | 10.6 | 65 | 0.13 | 0 | (0.377, 0.432) | 95.2 |
| Example 6 | 10.6 | 65 | 0.13 | 0.02 | (0.362, 0.410) | 90.1 |
| Example 7 | 10.6 | 65 | 0.13 | 0.05 | (0.354, 0.396) | 80.6 |
| Example 8 | 10.6 | 65 | 0.13 | 0.11 | (0.339, 0.370) | 68.5 |
| Comparative Example 1 | 0 |  |  | 0 | (0.430, 0.511) | 100 |
| Comparative Example 2 | 0 |  |  | 0.36 | (0.322, 0.345) | 45.0 |

The chromaticity coordinates of the object colors were (0.362, 0.410) in Example 6 and (0.377, 0.432) in Example 1. In other words, the object color in Example 6 was whiter than the object color in Example 1.

The luminous fluxes were 90.10% in Example 6 and 45.0% in Comparative Example 2. In other words, in Example 6, the luminous flux was substantially maintained while the object color being whiter.

Certain embodiments of the present invention are specifically described above, but the scope of the present invention is not limited to the description above and should be broadly interpreted on the basis of the claims. The scope of the present invention also encompasses various modifications based on these descriptions.

The light-emitting devices according to certain embodiments of the present disclosure can be used for lighting devices, backlights for liquid-crystal panels, and other apparatuses.

What is claimed is:

1. A method of manufacturing a light-emitting device, the method comprising:
    providing a first intermediate product including:
    a base member having a recess, and
    a light-emitting element placed on or above an inner bottom surface of the base member;
    injecting into the recess a resin including a light-diffusing agent that includes hollow particles to form a light-transmissive member in a convex shape with a thickness that gradually increases from a peripheral portion of the light-transmissive member toward a central portion of the light-transmissive member;

allowing the hollow particles to float up to a first surface of the injected light-transmissive member and to gather in the central region of the light-transmissive member; and hardening the light-transmissive member to form the light-emitting device, wherein, in a plan view, the central portion of the first surface of the light-transmissive member has irregularities formed by the light-diffusing agent and a peripheral region including the outer peripheral portion of the first surface of the light-transmissive member is smooth without the irregularities formed by the light-diffusing agent.

2. The method of manufacturing a light-emitting device according to claim 1, wherein the light-transmissive member further comprises a phosphor, and wherein, the light-transmissive member is formed so that the phosphor density at the light-emitting element side of the light-transmissive member is higher than the phosphor density at the first surface side of the light-transmissive member.

3. The method of manufacturing a light-emitting device according to claim 1, wherein the hollow particles are allowed to float up so that at least a portion of the light-diffusing agent is exposed at the first surface of the light-transmissive member and/or the light-diffusing agent is covered with the light-transmissive member to form irregularities by the hollow particles on the first surface of the light-transmissive member.

4. The method of manufacturing a light-emitting device according to claim 1, wherein the light-diffusing agent has a particle size in a range of 20 μm to 70 μm.

5. The method of manufacturing a light-emitting device according to claim 1, wherein the light-diffusing agent has a bulk density relative to the light-transmissive member in a range of 0.1 g/cm3 to 0.7 g/cm3.

6. The method of manufacturing a light-emitting device according to claim 1, wherein the hollow particles are allowed to float up so that the light-diffusing agent is located at the central region of the light-transmissive member in a plan view and the light-diffusing agent is not present at the peripheral portion of the light-transmissive member in a cross-sectional view.

7. The method of manufacturing a light-emitting device according to claim 1, wherein the hollow particles have a spherical shape.

8. The method of manufacturing a light-emitting device according to claim 1, wherein the light-emitting device comprises a plurality of the light-emitting elements.

9. The method of manufacturing a light-emitting device according to claim 1, wherein a base material of the light-transmissive member comprises a silicone resin.

* * * * *